United States Patent
Singidi et al.

(10) Patent No.: US 11,288,149 B2
(45) Date of Patent: *Mar. 29, 2022

(54) FLASH MEMORY BLOCK RETIREMENT POLICY

(71) Applicant: Micron Technology, Inc., Boise, ID (US)

(72) Inventors: Harish Reddy Singidi, Fremont, CA (US); Giuseppe Cariello, Boise, ID (US); Deping He, Boise, ID (US); Scott Anthony Stoller, Boise, ID (US); Devin Batutis, San Jose, CA (US); Preston Allen Thomson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/065,254

(22) Filed: Oct. 7, 2020

(65) Prior Publication Data

US 2021/0019241 A1 Jan. 21, 2021

Related U.S. Application Data

(63) Continuation of application No. 16/504,067, filed on Jul. 5, 2019, now Pat. No. 10,824,527, which is a
(Continued)

(51) Int. Cl.
*G06F 11/20* (2006.01)
*G11C 16/34* (2006.01)
(Continued)

(52) U.S. Cl.
CPC ...... *G06F 11/2094* (2013.01); *G06F 11/1068* (2013.01); *G11C 16/349* (2013.01);
(Continued)

(58) Field of Classification Search
CPC .................................................. G06F 11/2094
See application file for complete search history.

(56) References Cited

U.S. PATENT DOCUMENTS

| 5,416,782 A | 5/1995 | Wells et al. |
| 5,675,540 A | 10/1997 | Roohparvar |

(Continued)

FOREIGN PATENT DOCUMENTS

| TW | 201423757 A | 6/2014 |
| TW | 201539466 A | 10/2015 |

(Continued)

OTHER PUBLICATIONS

U.S. Appl. No. 15/690,903 U.S. Pat. No. 10,387,281, filed Aug. 30, 2017, Flash Memory Block Retirement Policy.
(Continued)

*Primary Examiner* — Douglas King
(74) *Attorney, Agent, or Firm* — Schwegman Lundberg & Woessner, P.A.

(57) ABSTRACT

Devices and techniques for a flash memory block retirement policy are disclosed herein. In an example embodiment, a first memory block is provisionally removed from service in response to encountering read errors in the first memory block. Memory pages of the first memory block are tested in a second mode comprising reading memory pages at different read voltages. A raw bit error rate (RBER) or a read window budget (RWB) is determined for memory pages at the different read voltages and the provisionally removed first memory block is returned to service or retired based on the determined RBER or the RWB.

19 Claims, 7 Drawing Sheets

Related U.S. Application Data continuation of application No. 15/690,903, filed on Aug. 30, 2017, now Pat. No. 10,387,281.

(51) Int. Cl.
  *G11C 29/00* (2006.01)
  *G06F 11/10* (2006.01)
  *G11C 16/04* (2006.01)

(52) U.S. Cl.
  CPC .......... *G11C 29/832* (2013.01); *G11C 29/883* (2013.01); *G06F 2201/82* (2013.01); *G11C 16/0483* (2013.01)

(56) References Cited

U.S. PATENT DOCUMENTS

| | | | |
|---|---|---|---|
| 6,014,755 | A | 1/2000 | Wells et al. |
| 6,405,323 | B1 | 6/2002 | Lin et al. |
| 6,549,459 | B2 | 4/2003 | Higuchi et al. |
| 7,171,536 | B2 | 1/2007 | Chang et al. |
| 7,254,763 | B2 | 8/2007 | Aadsen et al. |
| 7,454,670 | B2 | 11/2008 | Kim et al. |
| 8,332,696 | B2 | 12/2012 | Zeng |
| 8,560,922 | B2 | 10/2013 | Bivens et al. |
| 8,595,573 | B2 | 11/2013 | Shalvi et al. |
| 8,645,776 | B2 | 2/2014 | Byom et al. |
| 8,856,588 | B2 | 10/2014 | Koinuma et al. |
| 9,183,070 | B2 | 11/2015 | Marquart et al. |
| 9,224,489 | B2 | 12/2015 | Chae et al. |
| 9,761,308 | B1 | 9/2017 | Cometti |
| 10,387,281 | B2 | 8/2019 | Singidi et al. |
| 10,824,527 | B2 | 11/2020 | Singidi et al. |
| 2009/0259806 | A1 | 10/2009 | Kilzer et al. |
| 2011/0173378 | A1 | 7/2011 | Filor et al. |
| 2013/0128666 | A1 | 5/2013 | Avila et al. |
| 2014/0043918 | A1 | 2/2014 | Ellis et al. |
| 2014/0215122 | A1 | 7/2014 | Li |
| 2014/0281822 | A1* | 9/2014 | Wu .................. G06F 11/1068 714/773 |
| 2014/0334228 | A1 | 11/2014 | Kim et al. |
| 2014/0347936 | A1 | 11/2014 | Ghaly |
| 2015/0178150 | A1 | 6/2015 | Silberman et al. |
| 2016/0118129 | A1 | 4/2016 | Muchherla et al. |
| 2017/0294237 | A1 | 10/2017 | Li et al. |
| 2019/0065331 | A1 | 2/2019 | Singidi et al. |
| 2019/0324876 | A1 | 10/2019 | Singidi et al. |

FOREIGN PATENT DOCUMENTS

| | | |
|---|---|---|
| TW | 201921368 A | 6/2019 |
| WO | WO-2019046548 A1 | 3/2019 |

OTHER PUBLICATIONS

U.S. Appl. No. 16/504,067 U.S. Pat. No. 10,824,527, filed Jul. 5, 2019, Flash Memory Block Retirement Policy.

"International Application Serial No. PCT/US2018/048788, International Preliminary Report on Patentability dated Mar. 12, 2020", 9 pgs.

"International Application Serial No. PCT/US2018/048788, International Search Report dated Nov. 29, 2018", 3 pgs.

"International Application Serial No. PCT/US2018/048788, Written Opinion dated Nov. 29, 2018", 7 pgs.

"Taiwanese Application Serial No. 107130106, Office Action dated May 17, 2019", w/ English Translation, 29 pgs.

"Taiwanese Application Serial No. 107130106, Response filed Aug. 14, 2019 to Office Action dated May 17, 2019", w/ English Claims, 52 pgs.

\* cited by examiner

FLASH MEMORY BLOCK RETIREMENT POLICY

PRIORITY APPLICATION

This application is a continuation of U.S. application Ser. No. 16/504,067, filed Jul. 5, 2019, which is a continuation of U.S. application Ser. No. 15/690,903, filed Aug. 30, 2017, now issued as U.S. Pat. No. 10,387,281, each of which are incorporated herein by reference in their entireties.

BACKGROUND

Memory devices are typically provided as internal, semiconductor, integrated circuits in computers or other electronic devices. There are many different types of memory, including volatile and non-volatile memory.

Volatile memory requires power to maintain its data, and includes random-access memory (RAM), dynamic random-access memory (DRAM), or synchronous dynamic random-access memory (SDRAM), among others.

Non-volatile memory can retain stored data when not powered, and includes flash memory, read-only memory (ROM), electrically erasable programmable ROM (EEPROM), static RAM (SRAM), erasable programmable ROM (EPROM), resistance variable memory, such as phase-change random-access memory (PCRAM), resistive random-access memory (RRAM), magnetoresistive random-access memory (MRAM), or 3D XPoint™ memory, among others.

Flash memory is utilized as non-volatile memory for a wide range of electronic applications. Flash memory devices typically include one or more groups of one-transistor, floating gate or charge trap memory cells that allow for high memory densities, high reliability, and low power consumption.

Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a bit line.

Both NOR and NAND architecture semiconductor memory arrays are accessed through decoders that activate specific memory cells by selecting the word line coupled to their gates. In a NOR architecture semiconductor memory array, once activated, the selected memory cells place their data values on bit lines, causing different currents to flow depending on the state at which a particular cell is programmed. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner that is unrestricted by their stored data values). Current then flows from the source line to the bit line through each series coupled group, restricted only by the selected memory cells of each group, placing current encoded data values of selected memory cells on the bit lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data.

However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to can refer to any memory cell that can store more than one bit of data per cell (i.e., that can represent more than two programmed states).

Traditional memory arrays are two-dimensional (2D) structures arranged on a surface of a semiconductor substrate. To increase memory capacity for a given area, and to decrease cost, the size of the individual memory cells has decreased. However, there is a technological limit to the reduction in size of the individual memory cells, and thus, to the memory density of 2D memory arrays. In response, three-dimensional (3D) memory structures such as 3D NAND architecture semiconductor memory devices are being developed to further increase memory density and lower memory cost.

Such 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure (e.g., a polysilicon structure) may extend adjacent a string of storage cells to form a channel for the storages cells of the string. In the example of a vertical string, the polysilicon structure may be in the form of a vertically extending pillar. In some examples the string may be "folded," and thus arranged relative to a U-shaped pillar. In other examples, multiple vertical structures may be stacked upon one another to form stacked arrays of storage cell strings.

Memory arrays or devices can be combined together to form a storage volume of a memory system, such as a solid-state drive (SSD), a Universal Flash Storage (UFS™) device, a MultiMediaCard (MMC) solid-state storage device, an embedded MMC device (eMMC™), etc. An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact.

An SSD can include a number of memory devices, including a number of dies or logical units (e.g., logical unit numbers or LUNs), and can include one or more processors or other controllers performing logic functions required to operate the memory devices or interface with external systems. Such SSDs may include one or more flash memory die, including a number of memory arrays and peripheral circuitry thereon. The flash memory arrays can include a number of blocks of memory cells organized into a number of physical pages. In many examples, the SSDs will also include DRAM or SRAM (or other forms of memory die or other memory structures). The SSD can receive commands from a host in association with memory operations, such as read or write operations to transfer data (e.g., user data and associated integrity data, such as error data and address data, etc.) between the memory devices and the host, or erase operations to erase data from the memory devices.

Flash memory devices may exhibit data errors for a number of reasons. For example, a memory cell may fail to retain its previously programmed state over some extended time period, such as when exposed to elevated temperatures. These types of errors are often called "data retention" errors, and are distinguished from other data retention errors in which a number of program/erase (P/E) cycles has exceeded some expected maximum. In other cases, the state of a memory cell may be read incorrectly if the temperature of the memory cell is significantly different from the temperature of the cell when it was programmed. Such errors are termed "cross-temperature" errors, which may occur when the cell temperature during a programming cycle is significantly higher or lower than the cell temperature during a subsequent reading cycle. Such errors may be more prevalent in changing and challenging environmental conditions, such as those that may be encountered in mobile and automotive applications, which may involve expansive operating temperature ranges.

Other errors may be produced when a memory cell is read, which may cause the threshold voltages of nearby memory cells to shift, possibly affecting the ability to read those nearby cells. Such "read disturb" errors have become more problematic as the density and speed of flash memory devices have improved.

The above errors, as well as others not explicitly discussed herein, may be viewed as intrinsic, as they typically occur as a result of various conditions that may be expected during the use of the memory device. In contrast, other memory cell errors, such as memory cell defects that occur during the manufacturing of the memory device, are more unexpected or extrinsic in nature, and thus tend to be more permanent than intrinsic errors.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In at least some example embodiments described below, a memory block may be tested to determine whether read errors exhibited by the memory block are of a temporary or more permanent nature. If read errors encountered in the memory block exceed a particular threshold or level, at least some of the data from the memory block may be stored elsewhere, and the memory block may be tested by erasing, programming, and reading the memory block a number of times to determine whether the read errors are more temporary (and thus potentially mitigated during the testing process) or more permanent in origin. Based on that determination, the memory block may be returned to service or permanently retired. In some example embodiments, a memory controller incorporated within the memory device containing the memory blocks may perform these operations, as such a controller is likely to be configured to exercise more control over one or more parameters of the erasing, programming, and reading processes of the memory device compared to a host device that employs the memory device.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., internet-of-things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile random-access memory (RAM) memory device, such as dynamic RAM (DRAM) mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 1:
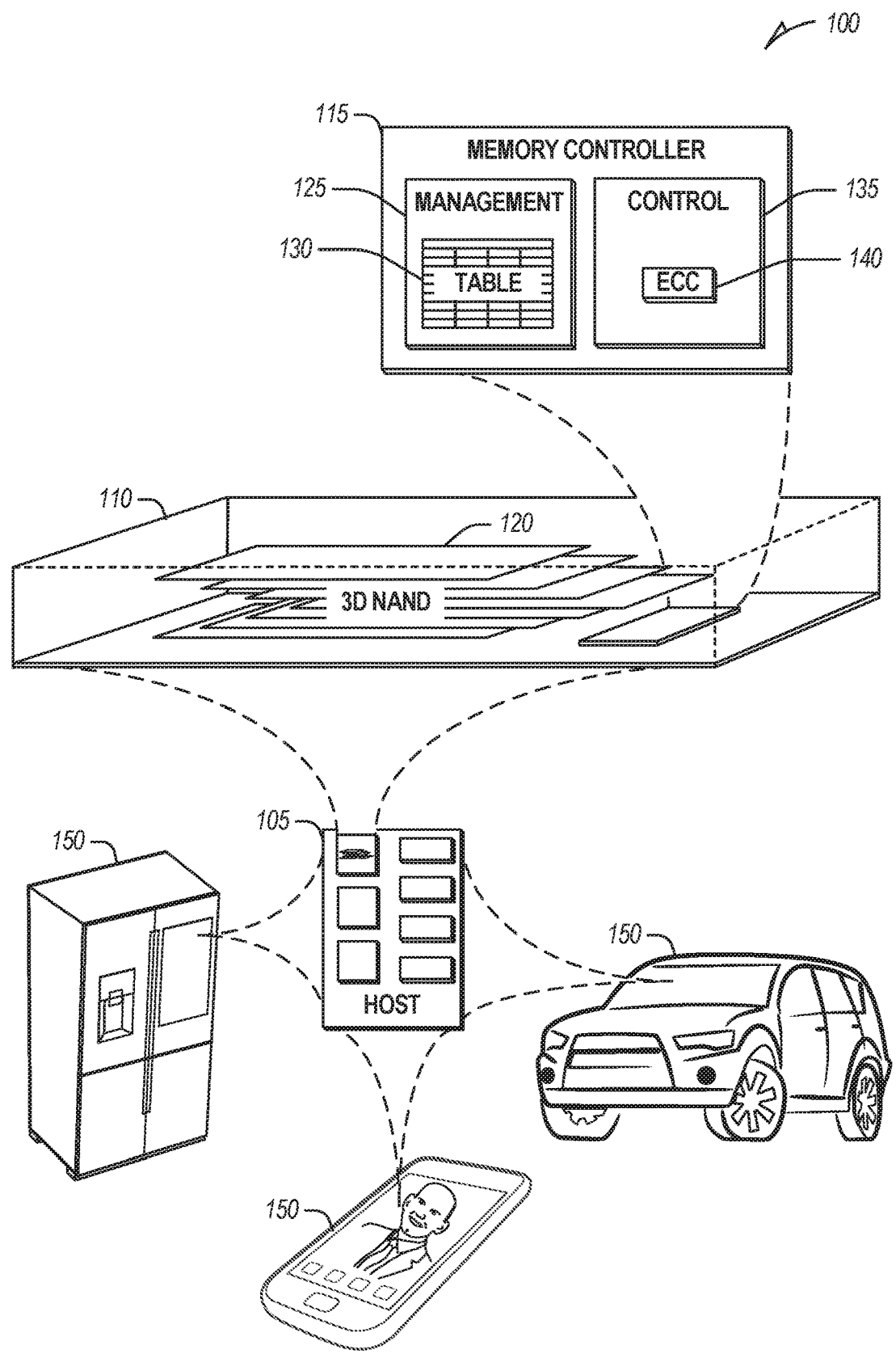
FIG. 1 illustrates an example of an environment including a memory device.

FIG. 1 illustrates an example of an environment 100 including a host device 105 and a memory device 110 configured to communicate over a communication interface. The host device 105 or the memory device 110 may be included in a variety of products 105, such as Internet of Things (IoT) devices (e.g., a refrigerator or other appliance, sensor, motor or actuator, mobile communication device, automobile, drone, etc.) to support processing, communications, or control of the product 150.

The memory device 110 includes a memory controller 115 and a memory array 120 including, for example, a number of individual memory die (e.g., a stack of three-dimensional (3D) NAND die). In 3D architecture semiconductor memory technology, vertical structures are stacked, increasing the number of tiers, physical pages, and accordingly, the density of a memory device (e.g., a storage device). In an example, the memory device 110 can be a discrete memory or storage device component of the host device 105. In other examples, the memory device 110 can be a portion of an integrated circuit (e.g., system on a chip (SOC), etc.), stacked or otherwise included with one or more other components of the host device 105.

One or more communication interfaces can be used to transfer data between the memory device 110 and one or more other components of the host device 105, such as a Serial Advanced Technology Attachment (SATA) interface, a Peripheral Component Interconnect Express (PCIe) interface, a Universal Serial Bus (USB) interface, a Universal Flash Storage (UFS) interface, an eMMC™ interface, or one or more other connectors or interfaces. The host device 105 can include a host system an electronic device, a processor, a memory card reader, or one or more other electronic devices external to the memory device 110. In some examples, the host 105 may be a machine having some portion, or all, of the components discussed in reference to the machine 500 of FIG. 5.

The memory controller 115 can receive instructions from the host 105, and can communicate with the memory array, such as to transfer data to (e.g., write or erase) or from (e.g., read) one or more of the memory cells, planes, sub-blocks, blocks, or pages of the memory array. The memory controller 115 can include, among other things, circuitry or firmware, including one or more components or integrated circuits. For example, the memory controller 115 can include one or more memory control units, circuits, or components configured to control access across the memory array 120 and to provide a translation layer between the host 105 and the memory device 110. The memory controller 115 can include one or more input/output (I/O) circuits, lines, or interfaces to transfer data to or from the memory array 120. The memory controller 115 can include a memory manager 125 and an array controller 135.

The memory manager 125 can include, among other things, circuitry or firmware, such as a number of components or integrated circuits associated with various memory management functions. For purposes of the present description example memory operation and management functions will be described in the context of NAND memory. Persons skilled in the art will recognize that other forms of non-volatile memory may have analogous memory operations or management functions. Such NAND management functions include wear leveling (e.g., garbage collection or reclamation), error detection or correction, block retirement, or one or more other memory management functions. The memory manager 125 can parse or format host commands (e.g., commands received from a host) into device commands (e.g., commands associated with operation of a memory array, etc.), or generate device commands (e.g., to accomplish various memory management functions) for the array controller 135 or one or more other components of the memory device 110.

The memory manager 125 can include a set of management tables 130 configured to maintain various information associated with one or more component of the memory device 110 (e.g., various information associated with a memory array or one or more memory cells coupled to the memory controller 115). For example, the management tables 130 can include information regarding block age, block erase count, error history, or one or more error counts (e.g., a write operation error count, a read bit error count, a read operation error count, an erase error count, etc.) for one or more blocks of memory cells coupled to the memory controller 115. In certain examples, if the number of detected errors for one or more of the error counts is above a threshold, the bit error can be referred to as an uncorrectable bit error. The management tables 130 can maintain a count of correctable or uncorrectable bit errors, among other things.

The array controller 135 can include, among other things, circuitry or components configured to control memory operations associated with writing data to, reading data from, or erasing one or more memory cells of the memory device 110 coupled to the memory controller 115. The memory operations can be based on, for example, host commands received from the host 105, or internally generated by the memory manager 125 (e.g., in association with wear leveling, error detection or correction, etc.).

The array controller 135 can include an error correction code (ECC) component 140, which can include, among other things, an ECC engine or other circuitry configured to detect or correct errors associated with writing data to or reading data from one or more memory cells of the memory device 110 coupled to the memory controller 115. The memory controller 115 can be configured to actively detect and recover from error occurrences (e.g., bit errors, operation errors, etc.) associated with various operations or storage of data, while maintaining integrity of the data transferred between the host 105 and the memory device 110, or maintaining integrity of stored data (e.g., using redundant RAID storage, etc.), and can remove (e.g., retire) failing memory resources (e.g., memory cells, memory arrays, pages, blocks, etc.) to prevent future errors.

The memory array 120 can include several memory cells arranged in, for example, a number of devices, planes, sub-blocks, blocks, or pages. As one example, a 48 GB TLC NAND memory device can include 18,592 bytes (B) of data per page (16,384+2208 bytes), 1536 pages per block, 548 blocks per plane, and 4 or more planes per device. As another example, a 32 GB MLC memory device (storing two bits of data per cell (i.e., 4 programmable states)) can include 18,592 bytes (B) of data per page (16,384+2208 bytes), 1024 pages per block, 548 blocks per plane, and 4 planes per device, but with half the required write time and twice the program/erase (P/E) cycles as a corresponding TLC memory device. Other examples can include other numbers or arrangements. In some examples, a memory device, or a portion thereof, may be selectively operated in SLC mode, or in a desired MLC mode (such as TLC, QLC, etc.).

In operation, data is typically written to or read from the NAND memory device 110 in pages, and erased in blocks. However, one or more memory operations (e.g., read, write, erase, etc.) can be performed on larger or smaller groups of memory cells, as desired. The data transfer size of a NAND memory device 110 is typically referred to as a page, whereas the data transfer size of a host is typically referred to as a sector.

Although a page of data can include a number of bytes of user data (e.g., a data payload including a number of sectors of data) and its corresponding metadata, the size of the page often refers only to the number of bytes used to store the user data. As an example a page of data having a page size of 4 KB may include 4 KB of user data (e.g., 8 sectors assuming a sector size of 512 B) as well as a number of bytes (e.g., 32 B, 54 B, 224 B, etc.) of metadata corresponding to the user data, such as integrity data (e.g., error detecting or correcting code data), address data (e.g., logical address data, etc.), or other metadata associated with the user data.

Different types of memory cells or memory arrays 120 can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code data than a memory device with a lower bit error rate). As an example, a multilevel cell (MLC) NAND flash device may have a higher bit error rate than a corresponding single-level cell (SLC) NAND flash device. As such, the MLC device may require more metadata bytes for error data than the corresponding SLC device.

Figure 2:
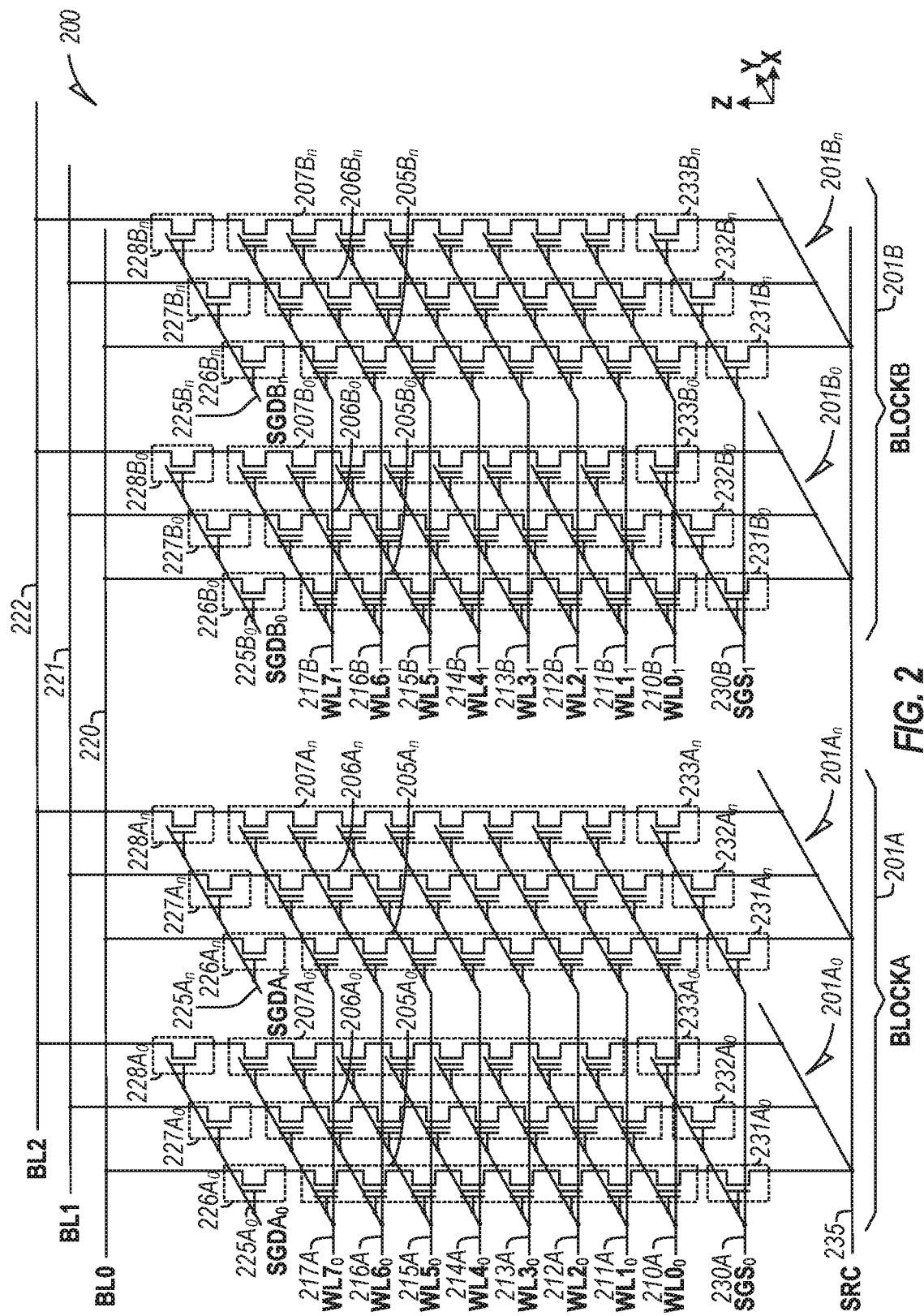
FIGS. 2-3 illustrate schematic diagrams of an example of a 3D NAND architecture semiconductor memory array.

FIG. 2 illustrates an example schematic diagram of a 3D NAND architecture semiconductor memory array 200 including a number of strings of memory cells (e.g., first-third $A_0$ memory strings $205A_0$-$207A_0$, first-third $A_n$ memory strings $205A_n$-$207A_n$, first-third $B_0$ memory strings $205B_0$-$207B_0$, first-third $B_n$ memory strings $205B_n$-$207B_n$, etc.), organized in blocks (e.g., block $A_n$ $201A_n$, block B 201B, etc.) and sub-blocks (e.g., sub-block $A_0$ $201A_0$, sub-block $A_n$ $201A_n$, sub-block $B_0$ $201B_0$, sub-block $B_n$ $201B_n$, etc.). The memory array 200 represents a portion of a greater number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 235 or a source-side select gate (SGS) (e.g., first-third $A_0$ SGS $231A_0$-$233A_0$, first-third $A_n$ SGS $231A_n$-$233A_n$, first-third $B_0$ SGS $231B_0$-$233B_0$, first-third $B_n$ SGS $231B_n$-$233B_n$, etc.) and a drain-side select gate (SGD) (e.g., first-third $A_0$ SGD $226A_0$-$228A_0$, first-third $A_n$ SGD $226A_n$-$228A_n$, first-third $B_0$ SGD $226B_0$-$228B_0$, first-third $B_n$ SGD $226B_n$-$228B_n$, etc.). Each string of memory cells in the 3D memory array can be arranged along the X direction as data lines (e.g., bit lines (BL) BL0-BL2 220-222), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 200 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 200 includes a control gate (CG) coupled to (e.g., electrically or otherwise operatively connected to) an access line (e.g., word lines (WL) $WL0_0$-$WL7_0$ 210A-217A, $WL0_1$-$WL7_1$ 210B-217B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $226A_0$-$228A_0$ can be accessed using an $A_0$ SGD line $SGDA_0$ $225A_0$, first-third $A_n$ SGD $226A_n$-$228A_n$ can be accessed using an $A_n$ SGD line $SGDA_n$ $225A_n$, first-third $B_0$ SGD $226B_0$-$228B_0$ can be accessed using an $B_0$ SGD line $SGDB_0$ $225B_0$, and first-third $B_n$ SGD $226B_n$-$228B_n$ can be accessed using an $B_n$ SGD line $SGDB_n$ $225B_n$. First-third $A_0$ SGS $231A_0$-$233A_0$ and first-third $A_n$ SGS $231A_n$-$233A_n$ can be accessed using a gate select line $SGS_0$ 230A, and first-third $B_0$ SGS $231B_0$-$233B_0$ and first-third $B_n$ SGS $231B_n$-$233B_n$ can be accessed using a gate select line $SGS_1$ 230B.

In an example, the memory array 200 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

Figure 3:
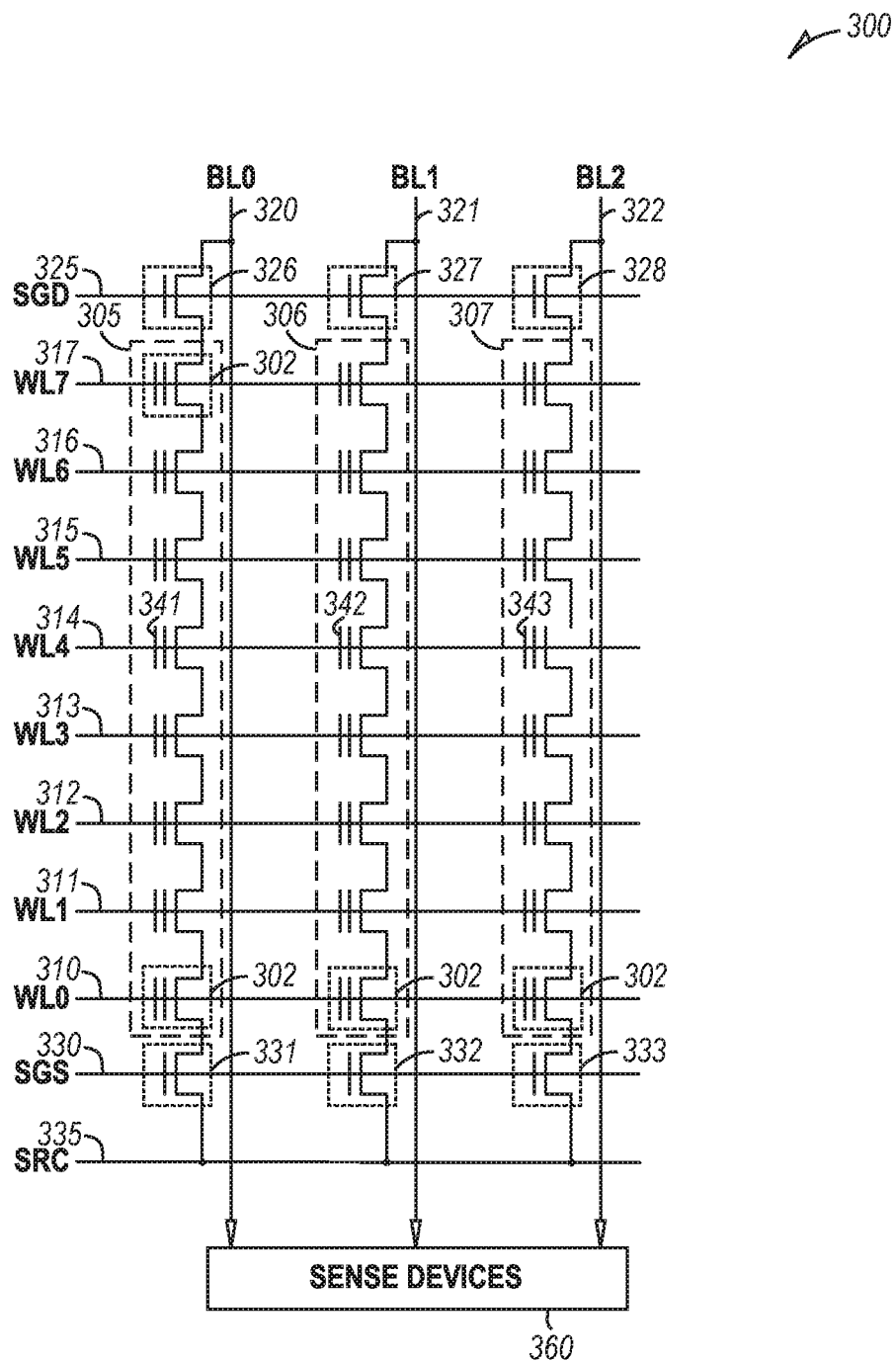

FIG. 3 illustrates an example schematic diagram of a portion of a NAND architecture semiconductor memory array 300 including a plurality of memory cells 302 arranged in a two-dimensional array of strings (e.g., first-third strings 305-307) and tiers (e.g., illustrated as respective word lines (WL) WL0-WL7 310-317, a drain-side select gate (SGD) line 325, a source-side select gate (SGS) line 330, etc.), and sense amplifiers or devices 360. For example, the memory array 300 can illustrate an example schematic diagram of a portion of one physical page of memory cells of a 3D NAND architecture semiconductor memory device, such as illustrated in FIG. 2.

Each string of memory cells is coupled to a source line (SRC) using a respective source-side select gate (SGS) (e.g., first-third SGS 331-333), and to a respective data line (e.g., first-third bit lines (BL) BL0-BL2 320-322) using a respective drain-side select gate (SGD) (e.g., first-third SGD 326-328). Although illustrated with 8 tiers (e.g., using word lines (WL) WL0-WL7 310-317) and three data lines (BL0-BL2 326-328) in the example of FIG. 3, other examples can include strings of memory cells having more or fewer tiers or data lines, as desired.

In a NAND architecture semiconductor memory array, such as the example memory array 300, the state of a selected memory cell 302 can be accessed by sensing a current or voltage variation associated with a particular data line containing the selected memory cell. The memory array 300 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., WL4), and thus, to a control gate of each memory cell coupled to the selected word lines (e.g., first-third control gates (CGs) 341-343 of the memory cells coupled to WL4). Programming pulses can begin, for example, at or near 15V, and, in certain examples can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as WL4, a pass voltage of 10V can be applied to one or more other word lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of word lines, etc., can be higher or lower, or more or less.

The sense amplifiers 360, coupled to one or more of the data lines (e.g., first, second, or third bit lines (BL0-BL2) 320-322), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines select gates, etc.) while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 4:
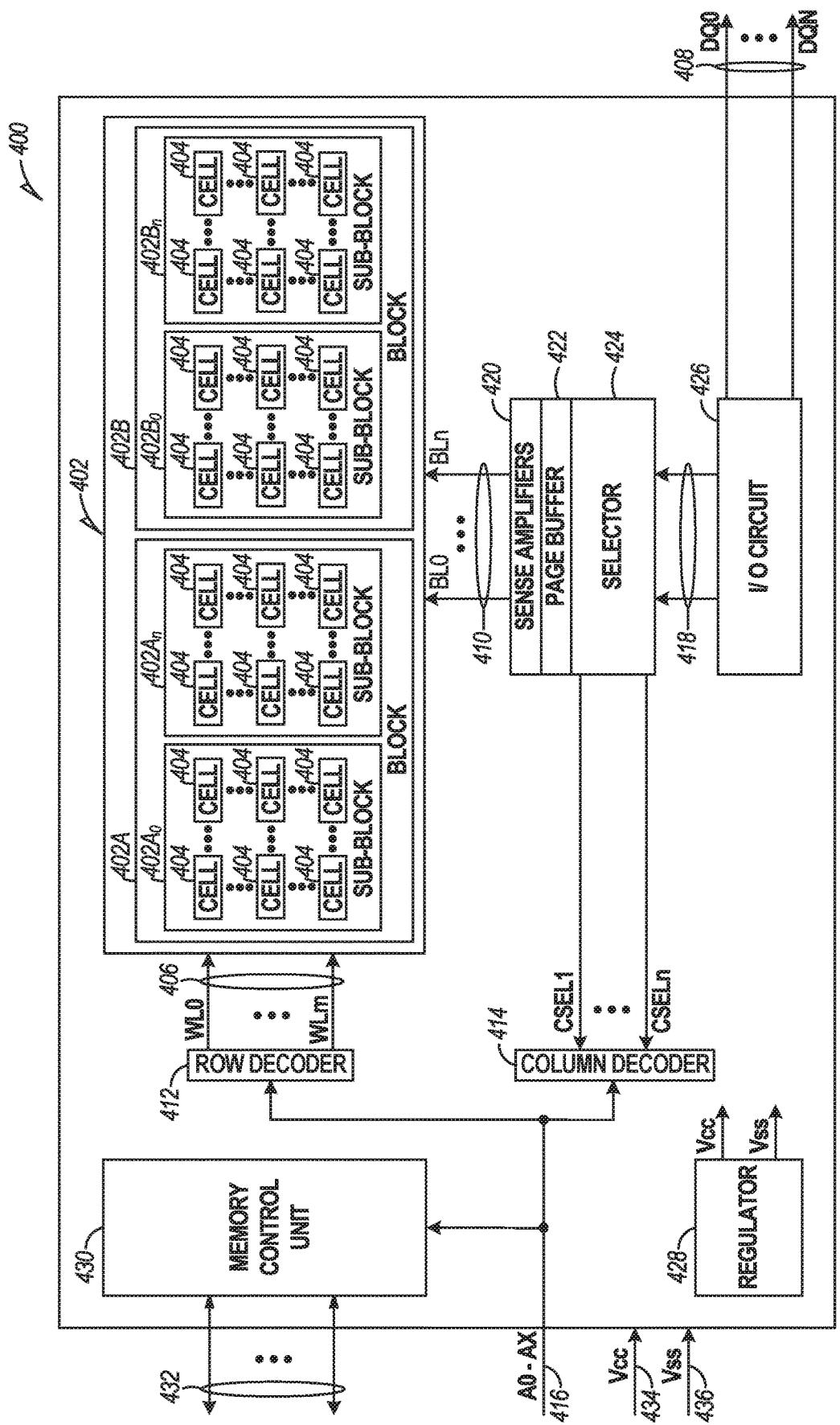
FIG. 4 illustrates a block diagram of an example memory module.

FIG. 4 illustrates an example block diagram of a memory device 400 including a memory array 402 having a plurality of memory cells 404, and one or more circuits or components to provide communication with, or perform one or more memory operations on, the memory array 402. The memory device 400 can include a row decoder 412, a column decoder 414, sense amplifiers 420, a page buffer 422, a selector 424 an input/output (I/O) circuit 426, and a memory control unit 430.

The memory cells 404 of the memory array 402 can be arranged in blocks, such as first and second blocks 402A, 402B. Each block can include sub-blocks. For example, the first block 402A can include first and second sub-blocks 402A$_0$, 402A$_n$, and the second block 402B can include first and second sub-blocks 402B$_0$, 402B$_n$. Each sub-block can include a number of physical pages, each page including a number of memory cells 404. Although illustrated herein as having two blocks, each block having two sub-blocks, and each sub-block having a number of memory cells 404, in other examples, the memory array 402 can include more or fewer blocks, sub-blocks, memory cells, etc. In other examples, the memory cells 404 can be arranged in a number of rows, columns, pages, sub-blocks, blocks, etc., and accessed using, for example, access lines 406, first data lines 410, or one or more select gates, source lines, etc.

The memory control unit 430 can control memory operations of the memory device 400 according to one or more signals or instructions received on control lines 432, including, for example, one or more clock signals or control signals that indicate a desired operation (e.g., write, read, erase, etc.), or address signals (A0-AX) received on one or more address lines 416. One or more devices external to the memory device 400 can control the values of the control signals on the control lines 432, or the address signals on the address line 416. Examples of devices external to the memory device 400 can include, but are not limited to, a host, a memory controller, a processor, or one or more circuits or components not illustrated in FIG. 4.

The memory device 400 can use access lines 406 and first data lines 410 to transfer data to (e.g., write or erase) or from (e.g., read) one or more of the memory cells 404. The row decoder 412 and the column decoder 414 can receive and decode the address signals (AD-AX) from the address line 416, can determine which of the memory cells 404 are to be accessed, and can provide signals to one or more of the access lines 406 (e.g., one or more of a plurality of word lines (WL0-WLm)) or the first data lines 410 (e.g., one or more of a plurality of bit lines (BL0-BLn)), such as described above.

The memory device 400 can include sense circuitry, such as the sense amplifiers 420, configured to determine the values of data on (e.g., read), or to determine the values of data to be written to, the memory cells 404 using the first data lines 410. For example, in a selected string of memory cells 404, one or more of the sense amplifiers 420 can read a logic level in the selected memory cell 404 in response to a read current flowing in the memory array 402 through the selected string to the data lines 410.

One or more devices external to the memory device 400 can communicate with the memory device 400 using the I/O lines (DQ0-DQN) 408, address lines 416 (A0-AX), or control lines 432. The input/output (I/O) circuit 426 can transfer values of data in or out of the memory device 400, such as in or out of the page buffer 422 or the memory array 402, using the I/O lines 408, according to, for example, the control lines 432 and address lines 416. The page buffer 422 can store data received from the one or more devices external to the memory device 400 before the data is programmed into relevant portions of the memory array 402, or can store data read from the memory array 402 before the data is transmitted to the one or more devices external to the memory device 400.

The column decoder 414 can receive and decode address signals (A0-AX) into one or more column select signals (CSEL1-CSELn). The selector 424 (e.g., a select circuit) can receive the column select signals (CSEL1-CSELn) and select data in the page buffer 422 representing values of data to be read from or to be programmed into memory cells 404. Selected data can be transferred between the page buffer 422 and the I/O circuit 426 using second data lines 418.

The memory control unit 430 can receive positive and negative supply signals, such as a supply voltage (Vcc) 434 and a negative supply (Vss) 436 (e.g., a ground potential), from an external source or supply (e.g., an internal or external battery, an AC-to-DC converter, etc.). In certain examples, the memory control unit 430 can include a regulator 428 to internally provide positive or negative supply signals.

Figure 5:
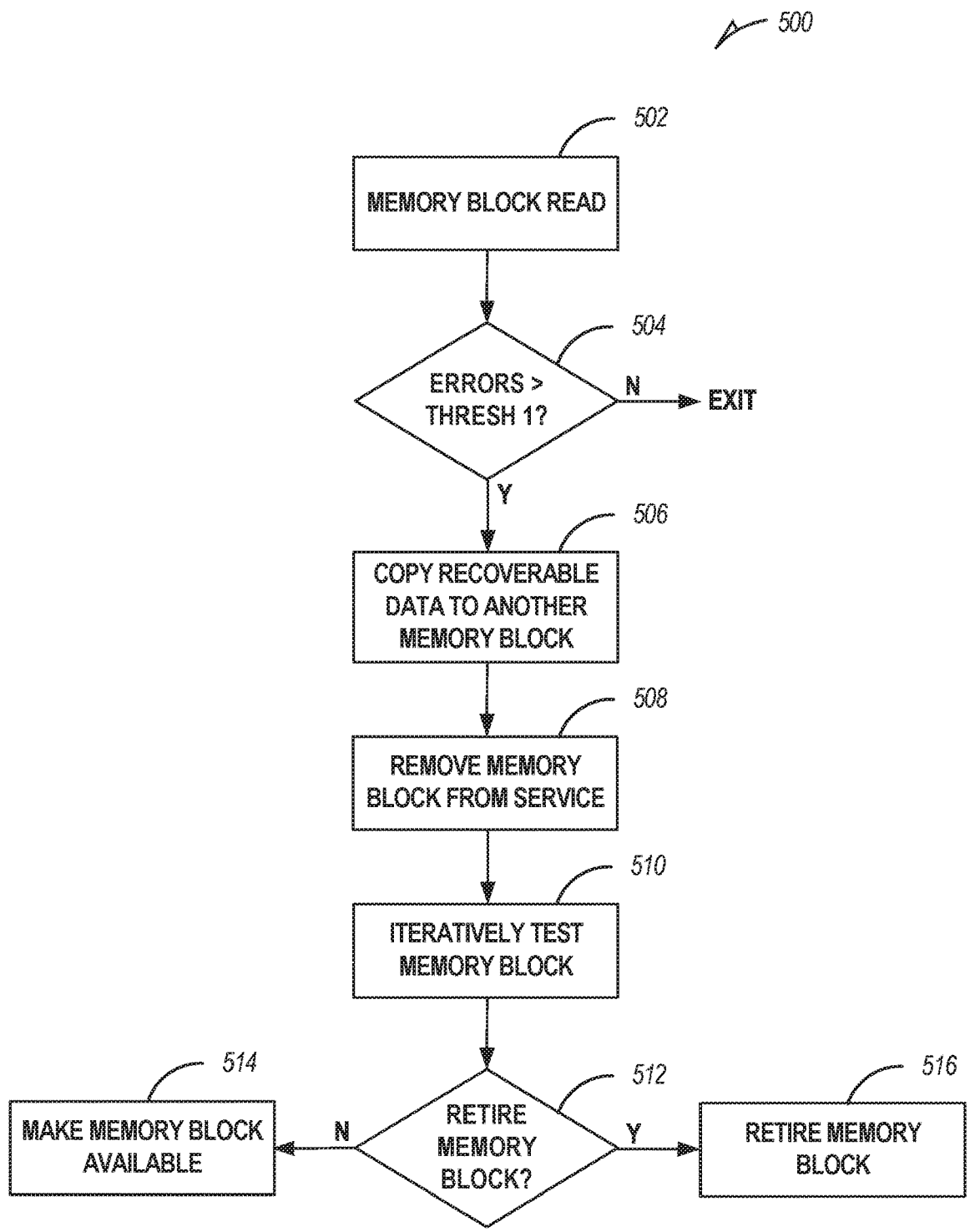
FIG. 5 illustrates a flow diagram of an example method of implementing a block retirement policy for a memory array.

FIG. 5 illustrates a flow diagram of an example method 500 of implementing a block retirement policy for a memory array (e.g., the memory array 120). In the example embodiments described below, the memory array 120 is a NAND flash memory array, as discussed in detail above. However, the method 500, as well as other methods described below may be applied to other memory arrays, devices, or systems.

In example embodiments in which a NAND flash memory array is used, the method 500 may be performed by the memory controller 115 by way of operations performed in either or both of the memory manager 125 and the array controller 135 of the memory device 110, and/or by the memory control unit 430 of the memory device 400. Other modules or structures other than those specifically described herein may perform the method 500 and others described below in other example embodiments.

In example embodiments of the method 500, a first memory block (e.g., memory block 201, 402) is read (operation 502), and a determination is made as to whether one or more read errors are encountered that exceed a first error threshold (operation 504). In some example embodiments, the operation 502 is initiated by way of a read command (or similar command) received by the memory controller 115 from a host 105. In other example embodiments, the operation 502 may be initiated by the memory controller 115 or another unit within a memory device (e.g., memory device 110, 400). For example, the memory controller 115 may perform the operation 502 as part of a memory "scrubbing" process, in which the memory controller 115 may read memory blocks that were previously written to determine if read errors discovered in those memory blocks exceed some threshold, and if so, possibly erase and rewrite those memory blocks to reduce the number of read errors encountered during subsequent read operations. In some example embodiments, the memory controller 115 may perform one or more error handling techniques, such as varying the read voltage (e.g., the control gate (CG) voltages) of one or more memory cells of the first memory block, retrying the read operation multiple times and the like, to recover the data.

Also in the method 500, if the number of read errors does not exceed the first error threshold, the remaining operations of the method 500 may be obviated, as the first memory block may be deemed to be possess an acceptable number of read errors. If, instead, the number of read errors exceeds the first error threshold, processing of the first memory block proceeds, as described below. In an example embodiment, the first error threshold is an error threshold or level at which all of the errors in the memory block are correctable. In another example embodiment, the first error threshold is an error threshold or level at which at least one of the errors in the first memory block is uncorrectable. In example embodiments, whether the read errors in the first memory block are correctable or uncorrectable may be determined using the ECC component 140 of the array controller 135, as discussed above.

Presuming the number of read errors exceeds the first error threshold, the memory controller 115 (e.g., using the memory manager 125) may copy data that is recoverable (e.g., correctable) from the first memory block to a second memory block (e.g., memory block 201, 402) (operation 506). For example, if all of the data of the first memory block are correctable, then all of the data may be copied to the second memory block. If less than all of the data of the first memory block are correctable, then only those portions of data that are correctable (e.g., data in less than all pages of the first memory block) may be copied to the second memory block. In other example embodiments, all of the data of the first memory block may be copied to the second memory block, even if some of the data is uncorrectable. Such information may be tracked by way of the management tables 130 of the memory manager 135, in some example embodiments.

In an example embodiment, the memory manager 125 may retrieve the second memory block from a "free pool" of memory blocks (e.g., a pool or group of memory blocks that are currently unassigned for access by the host 105) prior to the copying of the recoverable data from the first memory block to the second memory block. Also in example embodiments, the memory manager 125 may temporarily or provisionally retire, or otherwise remove from service, the first memory block (operation 508), thus preventing access to the first memory block by the host 105.

After the copying of the recoverable data from the first memory block (operation 506) and the removing of the first memory block from service (operation 508), the array controller 135 may iteratively test the first memory block (operation 510) to determine whether the first memory block should be retired (operation 512). In example embodiments described in greater detail below, the array controller 135 may determine whether any of the pages of the first memory block exhibited a number of read errors exceeding a second error threshold during the testing (operation 512). An example of at least a portion of a page of the first memory block is depicted in FIG. 3, as described above. Some example embodiments of the iterative testing of the first memory block are described below in conjunction with FIG. 6. In an example embodiment the second error threshold may be an error threshold at which all the read errors are correctable. In various example embodiments, the second error threshold may be the same as, or different from, the first error threshold.

If none of the pages of the first memory block exhibit a number of read errors exceeding the second error threshold, the memory controller 115 (e.g., using the memory manager 125) may make the memory block available for use (operation 514), such as by returning the first memory block 514 to the free pool. If, instead, one or more of the pages of the first memory block exhibit a number of read errors exceeding the second error threshold, the memory controller 115 may permanently retire the first memory block (operation 516), thus preventing use of the first memory block by the host 105.

While the operations 502-516 are presented in a particular order in FIG. 5, other orders of execution of the operations 502-516 may be possible, including simultaneous, concurrent, or overlapping execution of two or more of the operations 502-516. For example, the copying of the data from the first memory block to the second memory block (operation 506) may occur after, or in concurrence with, the removing of the first memory block from service (operation 508).

In an example embodiment, the operations 506 through 516 of FIG. 5 may be performed as background operations, or while the memory device 110 is operating in a background mode during which the memory device 110 does not process access requests to the memory array 120 from the host 105. For example, in an example embodiment in which the memory device 110 supports the eMMC™ standard, the operation 506 through 516 may be performed as background operations (BKOPS).

Figure 6:
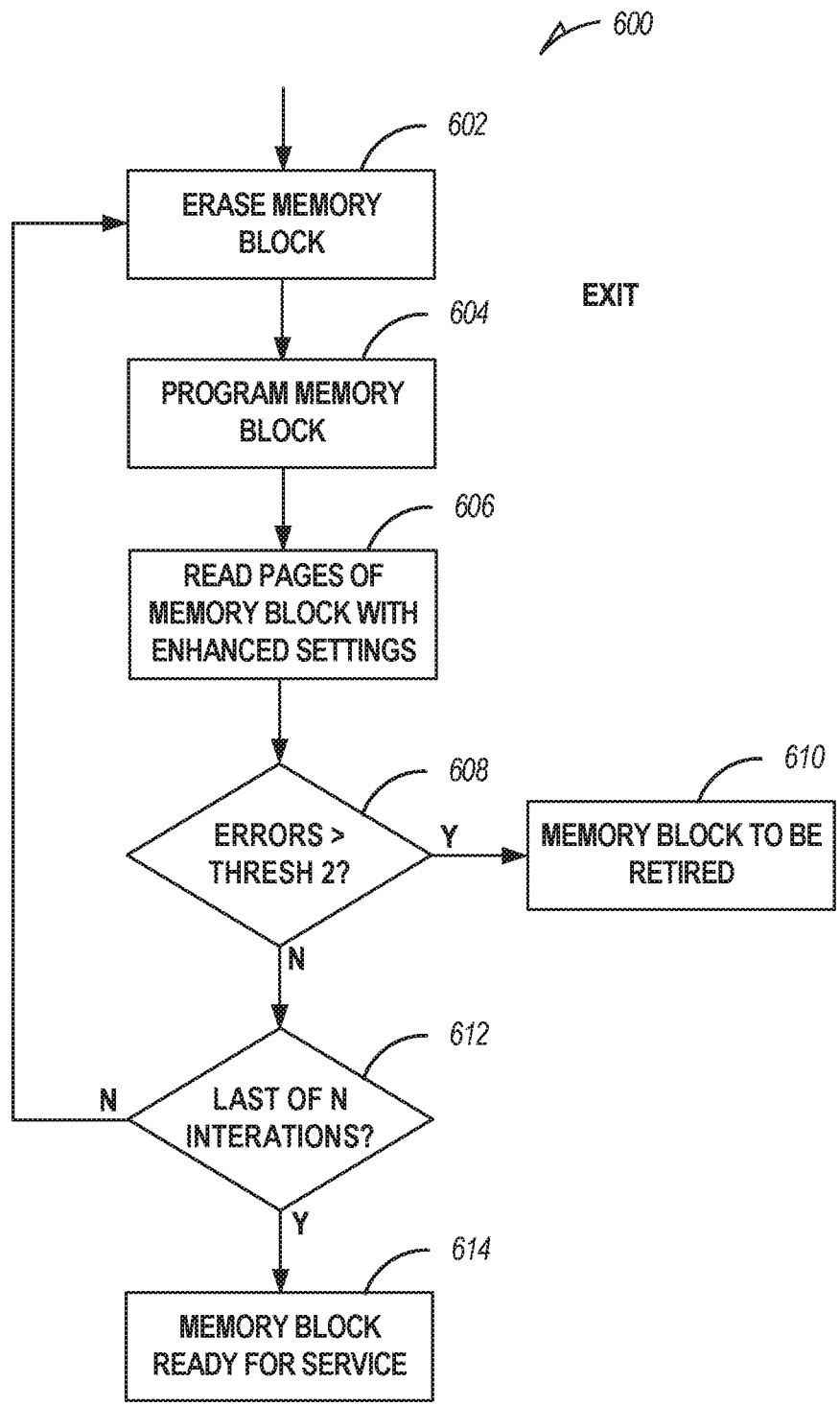
FIG. 6 illustrates a flow diagram of an example method of testing a memory block in the example block retirement policy method of FIG. 5.

FIG. 6 illustrates a flow diagram of an example method 600 of testing a memory block in the example block retirement policy method 500 of FIG. 5. In an example embodiment, operations 602 through 614 of FIG. 6 serve as an example of the iterative testing of the first memory block (e.g., memory block 201, 402) (operation 510 of FIG. 5).

In the method 600, at the start of each of one or more iterations, ti memory controller 115 (e.g., via the array controller 135) may cause the first memory block to be erased (operation 602) and then programmed or written (operation 604). In some example embodiments, the erasure of the first memory block is accomplished as a single, block-level erasure. Also in example embodiments, while each byte, word, or other separately addressable location of the first memory block may carry individual data, the actual writing operation may occur on a page-by-page basis, or even on a block-wide basis. Writing of data may occur in other increments of the first memory block in other example embodiments. As indicated above, the writing of a page of the first memory block may also include the writing of ECC data to facilitate the reading and associated correction of bit errors associated with that page.

In an example embodiment, the data written to each page of the first memory block may take any number of forms. For example, since an erasure of data may result in that data being read as all ones, the data written to each page may be all zeros, alternating ones and zeros, or any other pattern. Also in some example embodiments, the data written to each page may vary from iteration to iteration.

During each iteration, after the programming of the first memory block 604 (operation 604), the array controller 135 may each page of the first memory block (operation 606), and the ECC code stored with that page may be employed to correct bit errors in the read data (e.g., using the KC component 140). In one example embodiment, the page may be read once using a nominal or default read voltage (e.g., a control gate (CG) voltage) normally expected to provide significant voltage threshold margin to render the lowest raw bit error rate (RBER). In other example embodiments, the page may employ an enhanced read mode, during which each page may be read one or more times during each iteration using one or more different read voltages. For example, the page may be read several times each using a different read voltage about some nominal or default read voltage level so that a particular read voltage that provides the greatest read window budget (RWB), and thus the lowest RBER, may be used in determining whether the first memory block should be retired or retained.

Based on the reading of each page, the memory controller 115, by way of the array controller 135 and the KC component 140, may determine whether the read errors of each pages exceeds the second error threshold (operation 608). In an example embodiment in which each page is read only once during an iteration, the memory controller 115 may determine that the read errors of a page exceed the second error threshold during that single read operation. In example embodiments, in which each page is read multiple times, such as by using one or more read voltages, the memory controller 115 may determine that the read errors of a page exceed the second error threshold if the second error threshold is exceeded for every read operation during a particular iteration. Such an example may help prevent an over-retirement of memory blocks (sometimes termed "overkill") that needlessly limits the number of memory blocks available for use by the host 105. In other examples, the memory controller 115 may determine that the read errors of a page exceed the second error threshold if the second error threshold is exceeded during at least some minimum number of read operations during a particular iteration, such as one, two, and so on.

Based on a determination that at least one page of the first memory block contains read errors that exceed the second error threshold during the current iteration, the memory controller 115 may determine that the first memory block is to be permanently retired (operation 610) and proceed to operation 512 of FIG. 5. Otherwise, based on a determination that no page of the first memory block contained read errors that exceed the second error threshold, the memory controller 115 may then determine whether any more iterations are to be performed (operation 612). If so, the memory controller 115 may proceed with erasing (operation 602) and programming (operation 604) the first memory block, and continuing as described above. Otherwise, if no more iterations remain to be performed, the memory controller 115 may determine the first memory block is ready for service (operation 614). In some example embodiments, the memory controller 115 may also erase the first memory block once more before proceeding to operation 512 of method 500 of FIG. 5. Any number of iterations (e.g., one, two, five, ten, etc.) may be employed in the method 600 of FIG. 6.

Thus, by employing at least some of the example embodiments described above, a memory block that exhibits read errors of a particular level may be removed from service (at least temporarily) and tested, such as during a background operational mode. Based on that testing, a determination may be made as to whether the read errors are more likely extrinsic and thus not likely to be remedied) or intrinsic (and therefore not representative of a permanent or chronic failure mode). Correspondingly, memory blocks with primarily intrinsic errors may be rehabilitated (e.g., via erasure) and returned to active service, while memory blocks with primarily extrinsic errors may be permanently retired to increase the overall RBER and performance level of the memory device 110. Such example embodiments may especially benefit memory devices employed in demanding environmental conditions, such as those often encountered in mobile and automotive applications by distinguishing between those read errors that may be a temporary result of a particular operating environment from those that may be more chronic.

Figure 7:
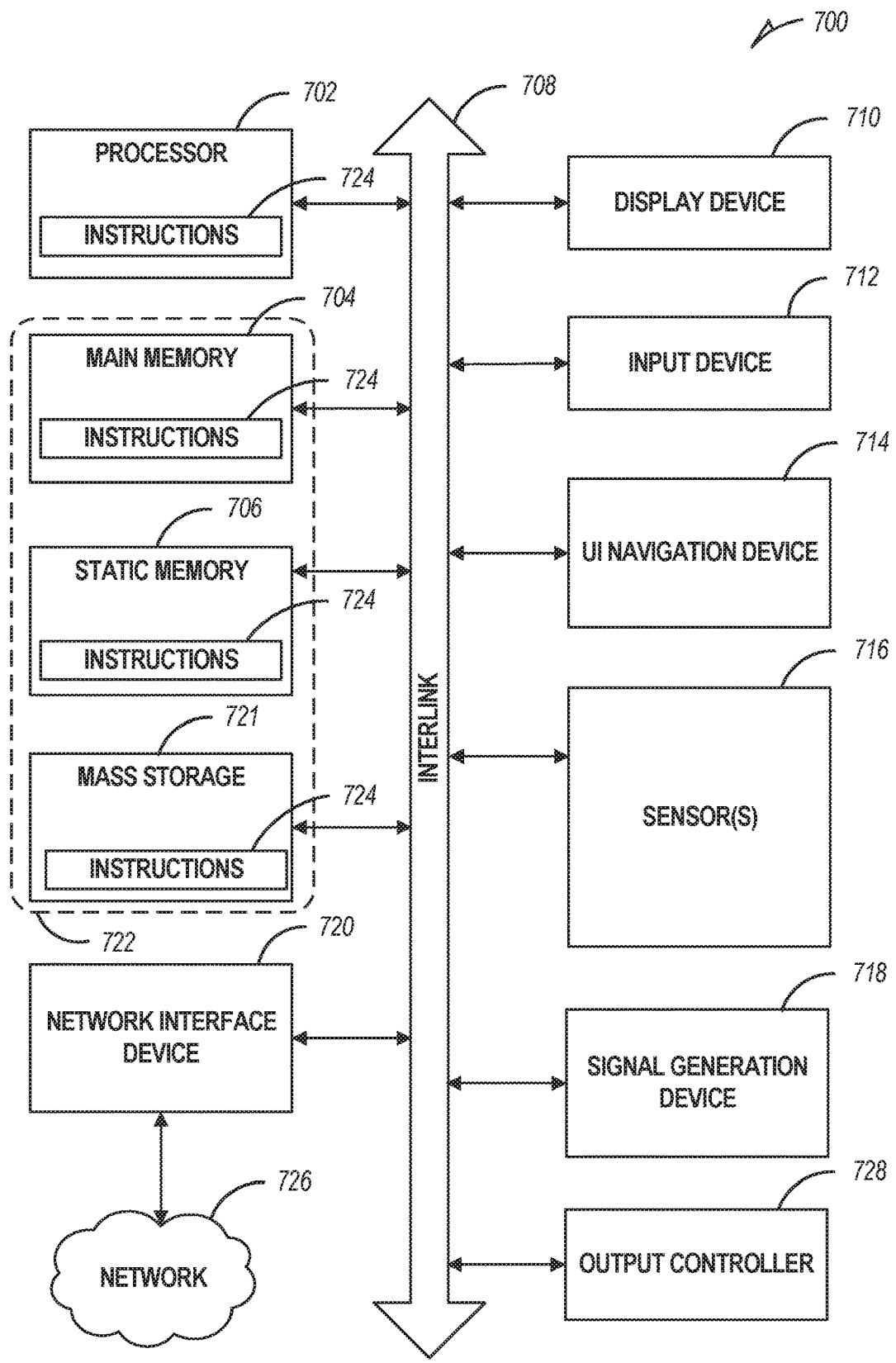
FIG. 7 is a block diagram illustrating an example of a machine upon which one or more embodiments may be implemented.

FIG. 7 illustrates a block diagram of an example machine 700 upon which any one or more of the techniques (e.g., methodologies) discussed herein may perform. In alternative embodiments, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in peer-to-peer (P2P) (or other distributed) network environment. The machine 700 may be a personal computer (PC), a tablet PC, a set-top box (STB), a personal digital assistant (PDA), a mobile telephone, a web appliance, an IoT device automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 700 may include a hardware processor 702 (e.g., a central processing unit (CPU), a graphics processing unit (GPU), a hardware processor core, or any combination thereof), a main memory 704 and a static memory 706, some or all of which may communicate with each other via an interlink (e.g., bus) 708. The machine 700 may further include a display unit 710, an alphanumeric input device 712 (e.g., a keyboard), and a user interface (UI) navigation device 714 (e.g., a mouse). In an example, the display unit 710, input device 712 and UI navigation device 714 may be a touch screen display. The machine 700 may additionally include a storage device (e.g., drive unit) 716, a signal generation device 718 (e.g., a speaker), a network interface device 720 and one or more sensors 716 such as a global positioning system (GPS) sensor, compass, accelerometer, or other sensor. The machine 700 may include an output controller 728, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 716 may include a machine readable medium 722 on which is stored one or more sets of data structures or instructions 724 (e.g., software) embodying or utilized by any one or more of the techniques or functions described herein. The instructions 724 may also reside, completely or at least partially, within the main memory 704, within static memory 706, or within the hardware processor 702 during execution thereof by the machine 700. In an example, one or any combination of the hardware processor 702, the main memory 704, the static memory 706, or the storage device 716 may constitute the machine readable medium 722.

While the machine readable medium 722 is illustrated as a single medium, the term "machine readable medium" may include a single medium or multiple media (e.g., a centralized or distributed database, or associated caches and servers) configured to store the one or more instructions 724.

The term "machine readable medium" may include any medium that is capable of storing, encoding, or carrying instructions for execution by the machine 700 and that cause the machine 700 to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine-readable medium with a plurality of particles having invariant (e.g., rest) mass. Accordingly, massed machine-readable media are not transitory propagating signals. Specific examples of massed machine readable media may include: non-volatile memory such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions 724 (e.g., software, programs, an operating system (OS), etc.) or other data are stored on the storage device 721, can be accessed by the memory 704 for use by the processor 702. The memory 704 (e.g., DRAM) is typically fast, but volatile, and thus a different type of storage than the storage device 721 (e.g., an SSD), which is suitable for long-term storage, including while in an "off" condition. The instructions 724 or data in use by a user or the machine 700 are typically loaded in the memory 704 for use by the processor 702. When the memory 704 is full, virtual space from the storage device 721 can be allocated to supplement the memory 704; however, because the storage 721 device is typically slower than the memory 704, and write speeds are typically at least twice as slow as read speeds, use of virtual memory can greatly reduce user experience due to storage device latency (in contrast to the memory 704, e.g., DRAM). Further, use of the storage device 721 for virtual memory can greatly reduce the usable lifespan of the storage device 721.

In contrast to virtual memory, virtual memory compression (e.g., the Linux® kernel feature "ZRAM") uses part of the memory as compressed block storage to avoid paging to the storage device 721. Paging takes place in the compressed block until it is necessary to write such data to the storage device 721. Virtual memory compression increases the usable size of memory 704, while reducing wear on the storage device 721.

Storage devices optimized for mobile electronic devices, or mobile storage, traditionally include MMC solid-state storage devices (e.g., micro Secure Digital (microSD™)

cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host device using a low-voltage differential signaling (LVDS) serial interface with dedicated read/write paths, further advancing greater read/write speeds.

The instructions 724 may further be transmitted or received over a communications network 726 using a transmission medium via the network interface device 720 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example the network interface device 720 may include one or more physical jacks (e.g., Ethernet, coaxial, or phone jacks) or one or more antennas to connect to the communications network 726. In an example, the network interface device 720 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine 700, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or ne or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under" are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein a vertical structure need not be strictly perpendicular to a surface of a substrate but may instead be generally perpendicular to the surface of the substrate, and may form an acute angle with the surface of the substrate (e.g., between 60 and 120 degrees, etc.).

In some embodiments described herein, different doping configurations may be applied to a source-side select gate (SGS), a control gate (CG), and a drain-side select gate (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Example 1 is a method for implementing a memory block retirement policy for a flash memory array, the method comprising: in response to encountering a read error in a first memory block of the flash memory array that exceeds a first error threshold: provisionally removing the first memory block from service, the first memory block comprising multiple memory pages; copying recoverable data of the first memory block to a second memory block of the flash memory array; after the removing of the first memory block from service, and the coping of the recoverable data of the first memory block to the second memory block, during each of multiple iterations: erasing the first memory block; programming the first memory block after the erasing of the first memory block; reading the multiple memory pages of the first memory block after the programming of the first memory block; and determining whether at least one of the multiple memory pages exhibits a read error exceeding a second error threshold during the reading of the multiple memory pages; and returning the first memory block to service in response to none of the multiple memory pages exhibiting a read error exceeding the second error threshold during the reading of the multiple memory pages during the multiple iterations.

In Example 2, the subject matter of Example 1 optionally includes permanently retiring the first memory block from service in response to at least one of the multiple memory pages exhibiting a read error exceeding the second error threshold during the multiple iterations.

In Example 3, the subject matter of any one or more of Examples 1-2 optionally include wherein the second memory block comprises a memory block from a pool of free memory blocks, and the method further comprises: placing the second memory block in service after the copying of the recoverable data of the first memory block to the second memory block.

In Example 4, the subject matter of any one or more of Examples 1-3 optionally include wherein the returning of the first memory block to service comprises returning the first memory block to a pool of free memory blocks.

In Example 5, the subject matter of any one or more of Examples 1-4 optionally include wherein the first error threshold comprises a correctable error threshold, and the recoverable data of the first memory block comprises all data of the first memory block.

In Example 6, the subject matter of any one or more of Examples 1-5 optionally include wherein the first error threshold comprises an uncorrectable error threshold, and the recoverable data of the first memory block comprises less than all data of the first memory block.

In Example 7, the subject matter of any one or more of Examples 1-6 optionally include wherein the encountering of the read error in the first memory block occurs during a read operation employing a default read voltage for the control gate of each memory cell of the first memory block.

In Example 8, the subject matter of any one or more of Examples 1-7 optionally include wherein the encountering of the read error in the first memory block occurs during a read operation employing a read voltage that is offset from a default read voltage for the control gate of each memory cell of the first memory block.

In Example 9, the subject matter of any one or more of Examples 1-8 optionally include wherein the reading of the multiple memory pages of the first memory block comprises varying a read voltage for at least one of the multiple memory pages during an iteration of the multiple iterations.

In Example 10, the subject matter of Example 9 optionally includes wherein the varying of the read voltage is employed to increase a read window budget during the iteration of the multiple iterations.

In Example 11, the subject matter of any one or more of Examples 1-10 optionally include receiving, from a host device, a read command to read the first memory block; performing a read operation on the first memory block in response to receiving the read command, wherein the encountering of the read error occurs during the read operation.

In Example 12, the subject matter of any one or more of Examples 1-11 optionally include wherein the encountering of the read error occurs during an error scrubbing process performed on the first memory block.

In Example 13, the subject matter of any one or more of Examples 1-12 optionally include wherein the multiple iterations occur during one or more periods of time during which commands from a host for access to the flash memory array are not processed.

Example 14 is a data storage system comprising: a flash memory array comprising multiple memory blocks, each of the multiple memory blocks comprising multiple memory pages; one or more hardware processors; and a memory storing instructions that, when executed by at least one of the one or more hardware processors, cause the data storage system to perform operations comprising: in response to encountering a read error in a first memory block of the flash memory array that exceeds a first error threshold: removing the first memory block from service, the first memory block comprising multiple memory pages; copying recoverable data of the first memory block to a second memory block of the flash memory array; after the removing of the first memory block from service, and the coping of the recoverable data of the first memory block to the second memory block, during each of multiple iterations: erasing the first memory block; programming the first memory block after the erasing of the first memory block; reading the multiple memory pages of the first memory block after the programming of the first memory block; and determining whether at least one of the multiple memory pages exhibits a read error exceeding a second error threshold during the reading of the multiple memory pages; and returning the first memory block to service in response to none of the multiple memory pages exhibiting a read error exceeding the second error threshold during the reading of the multiple memory pages during the multiple iterations.

In Example 15, the subject matter of Example 14 optionally includes wherein: the first error threshold comprises an uncorrectable error threshold; and the encountering of the read error in the first memory block persists after an error handling process is performed on the first memory block.

In Example 16, the subject matter of any one or more of Examples 14-15 optionally include wherein the reading of the multiple memory pages of the first memory block comprises varying a read voltage for at least one of the multiple memory pages during an iteration of the multiple iterations.

In Example 17, the subject matter of Example 16 optionally includes wherein the reading of the multiple memory pages of the first memory block comprises reading each of the multiple memory pages multiple times while varying the read voltage during the iteration of the multiple iterations.

In Example 18, the subject matter of any one or more of Examples 14-17 optionally include wherein the flash memory array comprises a multi-level cell NAND memory array.

In Example 19, the subject matter of any one or more of Examples 14-18 optionally include wherein: the flash memory array comprises a three-dimensional NAND memory array; and each of the multiple memory pages of the three-dimensional NAND memory array comprises a vertically-oriented two-dimensional array of memory cells.

Example 20 is a non-transitory computer-readable data storage storing instructions that, when executed by one or more hardware processors of a data storage system, cause the data storage system to perform operations comprising: in response to encountering a read error in a first memory block of a flash memory array that exceeds a first error threshold: removing the first memory block from service, the first memory block comprising multiple memory pages; copying recoverable data of the first memory block to a second memory block of the flash memory array; after the removing of the first memory block from service, and the coping of the recoverable data of the first memory block to the second memory block, during each of multiple iterations: erasing the first memory block; programming the first memory block after the erasing of the first memory block; reading the multiple memory pages of the first memory block after the programming of the first memory block; and determining whether at least one of the multiple memory pages exhibits a read error exceeding a second error threshold during the reading of the multiple memory pages; and returning the first memory block to service in response to none of the multiple memory pages exhibiting a read error exceeding the second error threshold during the reading of the multiple memory pages during the multiple iterations.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A data storage system, comprising:
 a flash memory array comprising multiple memory blocks, each of the multiple memory blocks comprising multiple memory pages;
 one or more memory controllers configured to:
  detect read errors in a first memory block of the flash memory array in a first read mode;
  in response to the detected read errors in the first memory block, provisionally remove the first memory block from service and test the first memory block in a second read mode, the second read mode comprising a background operation mode, wherein, to test the first memory block in the second read mode, the one or more controllers are configured to:

program data to the first memory block at each of multiple test iterations;

read memory pages of the first memory block at different read voltages at each of the multiple test iterations;

determine a raw bit error rate (RBER) for the memory pages at the different read voltages; and determine whether to return the provisionally removed first memory block to service or retire the first memory block based on the determined RBER for the different read voltages.

2. The data storage system of claim 1, wherein, to test the first memory block in the second read mode, the one or more controllers are configured to:

copy data from the first memory block to a free memory block; and erase the first memory block.

3. The data storage system of claim 1, wherein the one or more memory controllers are configured to program different data to the first memory block for each of the multiple test iterations.

4. The data storage system of claim 1, wherein the one or more memory controllers comprises a memory controller for the data storage system and the data storage system comprising a single memory device.

5. The data storage system of claim 1, wherein the background operation mode is a mode during which commands from a host for access to the flash memory array are not processed.

6. The data storage system of claim 1, wherein the one or more memory controllers are configured to:

receive, from a host device, a read command to read the first memory block; and perform a read operation on the first memory block in response to a received read command, wherein the one or more controllers are configured to detect the read errors during the read operation.

7. The data storage system of claim 6, wherein the second error threshold comprises a correctable error threshold, at which all detected read errors are correctable.

8. The data storage system of claim 1, wherein the one or more memory controllers are configured to, in response to the detected read errors in the first memory block exceeding the first error threshold, copy data of the first memory block to a second memory block of the flash memory array and erase the first memory block before provisionally removing the first memory block from service.

9. The data storage system of claim 1, wherein, to detect read errors in the first memory block of the flash memory array in the first read mode, the one or more memory controllers are configured to detect read errors in the first memory block that exceed a first error threshold, the first error threshold comprising an uncorrectable error threshold.

10. The data storage system of claim 1, wherein the one or more memory controllers are configured to determine to return the provisionally removed first memory block to service if the determined read errors do not exhibit a read error rate exceeding a second error threshold at the read voltage associated with the lowest determined RBER.

11. The data storage system of claim 1, wherein the multiple test iterations comprise more than two test iterations.

12. A method for implementing a memory block retirement policy for a flash memory array, the method comprising:

detecting read errors in a first memory block of a flash memory array in a first read mode;

in response to the detected read errors in the first memory block, provisionally removing the first memory block from service and testing the first memory block in a second read mode, the second read mode comprising a background operation mode, wherein testing the first memory block in the second read mode comprises:

programming data to the first memory block at each of multiple test iterations, reading memory pages of the first memory block at different read voltages at each of the multiple test iterations;

determining a raw bit error rate (RBER) for the memory pages at the different read voltages; and determining whether to return the provisionally removed first memory block to service or retire the first memory block based on the determined RBER for the different read voltages.

13. The method of claim 12, wherein testing the first memory block in the second read mode comprises:

copying data from the first memory block to a free memory block;

erasing the first memory block.

14. The method of claim 12, wherein programming data to the first memory block at each of the multiple test iterations comprises programming different data to the first memory block for each of the multiple test iterations.

15. The method of claim 12, wherein the multiple test iterations comprise more than two test iterations.

16. A non-transitory computer-readable data storage storing instructions that, when executed by one or more hardware processors of a data storage system, cause the data storage system to perform operations comprising:

detecting read errors in a first memory block of a flash memory array in a first read mode;

in response to the detected read errors in the first memory block, provisionally removing the first memory block from service and testing the first memory block in a second read mode, the second read mode comprising a background operation mode, wherein testing the first memory block in the second read mode comprises:

programming data to the first memory block at each of multiple test iterations;

reading memory pages of the first memory block at different read voltages at each of the multiple test iterations;

determining a raw bit error rate (RBER) for the memory pages at the different read voltages; and determining whether to return the provisionally removed first memory block to service or retire the first memory block based on the determined RBER for the different read voltages.

17. The non-transitory computer-readable data storage of claim 16, wherein testing the first memory block in the second read mode comprises:

copying data from the first memory block to a free memory block;

erasing the first memory block.

18. The non-transitory computer-readable data storage of claim 16, wherein programming data to the first memory block at each of the multiple test iterations comprises programming different data to the first memory block for each of the multiple test iterations.

19. The non-transitory computer-readable data storage of claim 16, wherein the multiple test iterations comprise more than two test iterations.

* * * * *